United States Patent [19]

Slocum, Jr.

[11] 4,095,221

[45] June 13, 1978

[54] ELECTRICAL STORM FORECAST SYSTEM

[76] Inventor: Chester D. Slocum, Jr., 1811 SW. 98th Ave., Miami, Fla. 33165

[21] Appl. No.: 671,028

[22] Filed: Mar. 29, 1976

[51] Int. Cl.² .............................................. G08B 21/00
[52] U.S. Cl. ................................ 340/421; 73/170 R; 324/72; 340/200; 340/309.3
[58] Field of Search .............. 340/421, 200; 324/72, 324/72.5, 32; 73/170

[56] References Cited

U.S. PATENT DOCUMENTS

| | | | |
|---|---|---|---|
| 2,993,165 | 7/1961 | Jauch | 324/32 |
| 3,344,344 | 9/1967 | Wales, Jr. | 324/72 X |
| 3,611,127 | 10/1971 | Vosteen | 324/72 |
| 3,667,036 | 5/1972 | Seachman | 324/72 |
| 3,753,117 | 8/1973 | Downing et al. | 324/72 X |
| 3,846,700 | 11/1974 | Sasaki | 324/72 |

Primary Examiner—John W. Caldwell, Sr.
Assistant Examiner—Daniel Myer
Attorney, Agent, or Firm—George B. Oujevolk

[57] ABSTRACT

An electrical storm forecast system includes a sensor unit for receiving electrostatic field information, an amplitude and phase detector coupled to the sensor unit and information processing means coupled to the amplitude phase detector.

6 Claims, 11 Drawing Figures

*FIG. 5* ( LOCAL SYSTEM )

*FIG. 6* ( REMOTE SENSOR AND DISTANCE READOUT )

ELECTRICAL STORM FORECAST SYSTEM

BACKGROUND OF THE INVENTION

The present invention relates to weather forecasting and more particularly to electrical storm forecasting.

BRIEF REVIEW OF THE PRIOR ART

The subject of weather forecasting and field meters has already received considerable attention as is evident from the following list of patents. However, none of these patents, as far as I am aware, have approached the subject with regard to the factors and measurements herein considered.

U.S. Pat. No. 2,032,932
U.S. Pat. No. 2,820,947
U.S. Pat. No. 2,449,068
U.S. Pat. No. 3,048,777
U.S. Pat. No. 3,396,337
U.S. Pat. No. 3,458,805
U.S. Pat. No. 3,516,984
U.S. Pat. No. 2,587,156
U.S. Pat. No. 2,663,842
U.S. Pat. No. 2,400,112
U.S. Pat. No. 3,482,235
U.S. Pat. No. 3,253,207
U.S. Pat. No. 3,256,481
U.S. Pat. No. 3,611,365
U.S. Pat. No. 3,465,245
U.S. Pat. No. 2,402,688
U.S. Pat. No. 2,637,841
U.S. Pat. No. 2,967,522
U.S. Pat. No. 3,603,951
U.S. Pat. No. 1,919,215
U.S. Pat. No. 3,026,501
U.S. Pat. No. 2,684,474
U.S. Pat. No. 3,121,196

From the foregoing prior art, it is apparent that one of the key units is the sensor unit which essentially is an electrostatic field meter that allows fields of less than one volt per centimeter to be measured.

Electrostatic field meters of the field mill type (U.S. Pat. Nos. 1,919,215 and 2,032,932) have had a limit as to the smallest amount of field that could be measured, controlled by three unpredictable factors. These factors are:

(1) electro-magnetic interference;
(2) the amount of electrical noise that comes from the motor; and
(3) the sensor boards get dirty and can not be cleaned easily.

In the present inventive concept the use of differential input with matched components produce a high order of common mode rejection that greatly reduces electromagnetic interference and electrical motor noise. By constructing the sensor board on a printed circuit card, this board may be easily removed for cleaning. This is necessary because dirt that accumulates will reduce the sensitivity of the sensor.

OBJECTS OF THE INVENTION

It is therefore an object of the present invention to provide a system wherein the sensor has the capability of detecting both negative and positive field variations.

Another object of the present invention is to provide a system wherein the sensor has the capability of detecting a wide range of field variations.

Still another object of the present invention is to provide a system wherein the processor has the ability to detect changes of field intensity as small as 1 volt/cm in 0.2 seconds or less.

It is also an object of the present invention to provide a system wherein the sensor has the capability of withstanding severe weather conditions.

Again it is an object of the invention to provide a system wherein the sensor has the capability of dependable service over a long period of time (several years).

Still another object of the invention is for a system wherein the sensor has the capability of being easily cleaned and calibrated.

SUMMARY OF THE INVENTION

Generally speaking, the sensor herein described has built-in complete testing means. Also, the terminal readout mechanism has the capability of displaying various levels of lightning probability, and, the terminal readout has some means of determining the differences between the potentials in the earlier charging stages of electrical storms and the field collapse. The system has out-put terminals for strip chart circuits, an alarm facility that is triggered by a certain level of probability or the detection of activity by the activity detector, and, the system has a method for indicating and holding for a given time, the highest probability that exists during any given period. A method for challenging the stored information to verify its truth is also provided.

The invention, as well as other objects and advantages thereof, will become more apparent from the following detailed description when taken together with the accompanying drawings in which:

DETAILED DESCRIPTION

The ability to predict severe weather has long been sought after by the scientist, meteorologist and inventor. But, before we can predict, we must understand what is currently known as to the building of an electrical storm, commonly called a thunderstorm. The very first indication that a thunderstorm is building up is a random radiation in the UHF range from a point in our atmosphere. These UHF signals appear primarily as electrical noise and are not readily identifiable and are generally difficult to localize. The generation of UHF noise very rapidly gives way to electromagnetic noise in the VHF range. These signals are also difficult to recognize and their location is quite difficult to determine. The storm now proceeds to generate electromagnetic noise in the LF range. These signals are now the result of some inner cloud discharges and distant lightning strokes to the earth. All of these signals are generally categorized in an area described as spherics. The lower frequency signals have been used in the past and are currently being used to determine the distant lightning storms. Spheric receivers must be generally desensitized so that man-made electromagnetic wave trains will not be received and be interpreted as a spheric response. This greatly reduces the reliability of such a predicting system. Such things as a switch being closed on a high line can produce electromagnetic signals that will easily deceive a spheric receiver.

Another facet of a building electrical storm is the development of the electrostatic field between the earth and the storm itself. As a storm builds, there are updrafts in the storm cell itself that act as an electrical pump. Warm air is funneled up through the center of the cloud and when this air strikes the cooler air of the upper atmosphere, moisture is condensed from the warm air and starts its fall back through the cloud as water droplets. These droplets of water remove electrons from the upper portion of the thunderhead. As these droplets descend, they encounter the warm air again that is at the bottom of the thunderhead. Here the water droplets are turned into vapor and it starts its upper travel again. But, before the water vapor travels up this funnel, it gives up its extra electrons to the lower portion of the thunderhead. If one now looks at the displacement of charges in this storm cell, one can readily determine that the upper portions are depleted of electrons and positive in charge with relationship, not only to the air around it, but to earth itself.

When one examines this thunderhead, one can readily see that the bottom portion contains a surplus of negative charges and when the field that is developed between this sector and the earth beneath becomes high enough, lightning will occur. If an electrostatic field monitoring station is located directly below this building storm cell, the first indication would be that of a reduction in the earth's normal positive electrostatic field. When we speak of the earth's normal field, we are speaking of the field resulting from the interdiction of the earth's magnetic field on the solar wind thereby producing what is called the Van Allen Radiation Belt. The occurrence and variation in these charged areas have been fairly well defined by both U.S. and Russian space probes. The average field on the earth is normally considered to range between 100 and 200 positive volts per meter of vertical spacing for the day time. The night time fields are generally near zero volts per vertical meter and some slight negative values such as 20 to 30 volts per vertical meter. Now, if there is a monitoring station directly under this building thunderhead, the first indication would be a general reduction of the positive day time field of the earth, or a more negative increase in the night time field. In either case, a very high negative field intensity will build very rapidly to values of between 3,000 and 10,000 volts per vertical meter. When negative field intensities of 3,000 volts are reached, under these conditions, the probabilities of a lightning stroke to earth are very high.

If the monitoring station is not directly under this build-up, and at a distance of several miles, the indications will be quite different. As was mentioned earlier, the entire upper portion of the storm cell has been depleted of electrons and in essence represents a highly charged positive area of the atmosphere. When we look from a distance at the wide view of this thunderhead, we see a large portion of positive charge and a very small portion of negative charge. The first indications our monitoring station will have at this location, will be intensification of the earth's normally positive day time background field. If these measurements are being metered at night time, the field will also go positive. As the electrical storm cell approaches our monitoring station, the intensity of this positive field will increase until we have field values in the order of positive 3,000 volts per vertical meter. As the storm cell continues to approach the monitoring station, our view of the under portion of this thunderhead will improve and at some point as the broad underside encroaches upon our view of the atmosphere, our monitoring station will measure equal portions of positive and negative fields from this thunderhead. At this moment, the field intensity as measured will be zero. This is a very important point in predicting the advent of lightning.

When the zero potential is reached under these conditions, the edge of the storm cell is virtually overhead and is now entering into the area of negative field from which nearly all lightning strokes occur.

During the time that the storm is active and producing electrical discharges to the earth, the storm cell is being reduced in its negative electrical current carriers. As the energy level input to the storm decreases, the ability of this thunderhead to equalize its charges from the surrounding air is reduced. The net result produces a highly positively charged cloud, which will produce a high positive reading on field monitoring equipment. The charge distribution in this cloud is now vertical since it extends through the entire area that was formerly our thunderhead. This highly positive vertical structure will attract negative ions which will produce a vertical sheath and which will produce an extremely high negative reading on field equipment when it passes overhead. The negative sheath so produced will attract the positive ions that are in the area and will produce a vertical column that will produce a positive reading on field monitoring station, when it passes overhead. This procedure will continue as if it were a damped oscillation until the existing background field of the earth prevails. What has just been described, however, is a model storm. But, all electrical storms generally follow this pattern.

Figure 1:
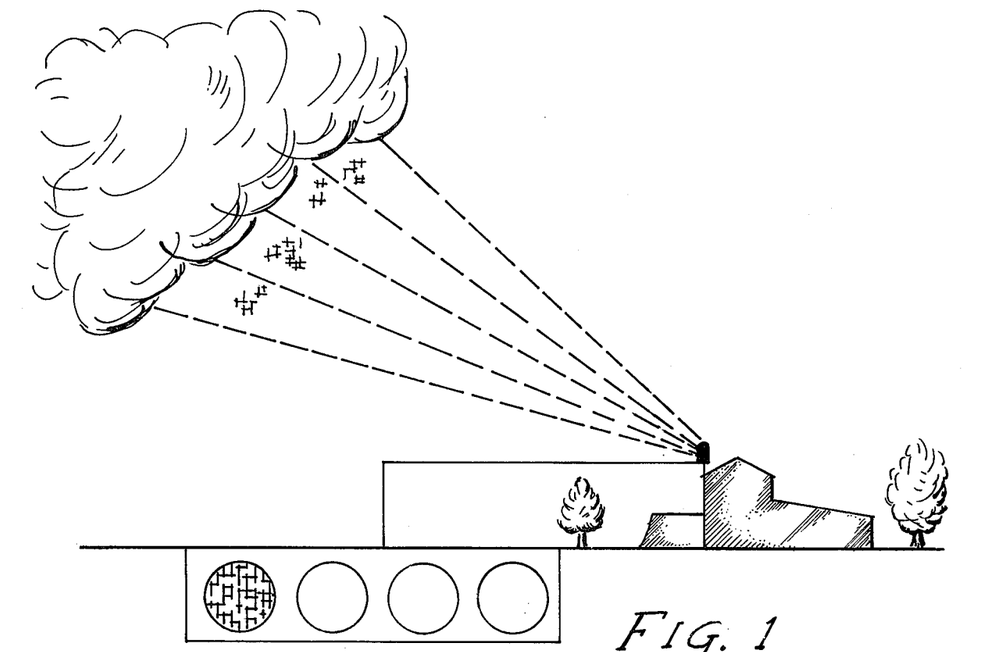
FIG. 1 is a perspective explanation of an electrical storm at a distance showing the first lamp signal.

From the foregoing, it appears that an approaching electrical storm will provide the following changes in atmospheric conditions:

FIG. 1. A station several miles away will sense intensification of the positive field increasing to about +500 volts per meter (yellow light 12a).

Figure 2:
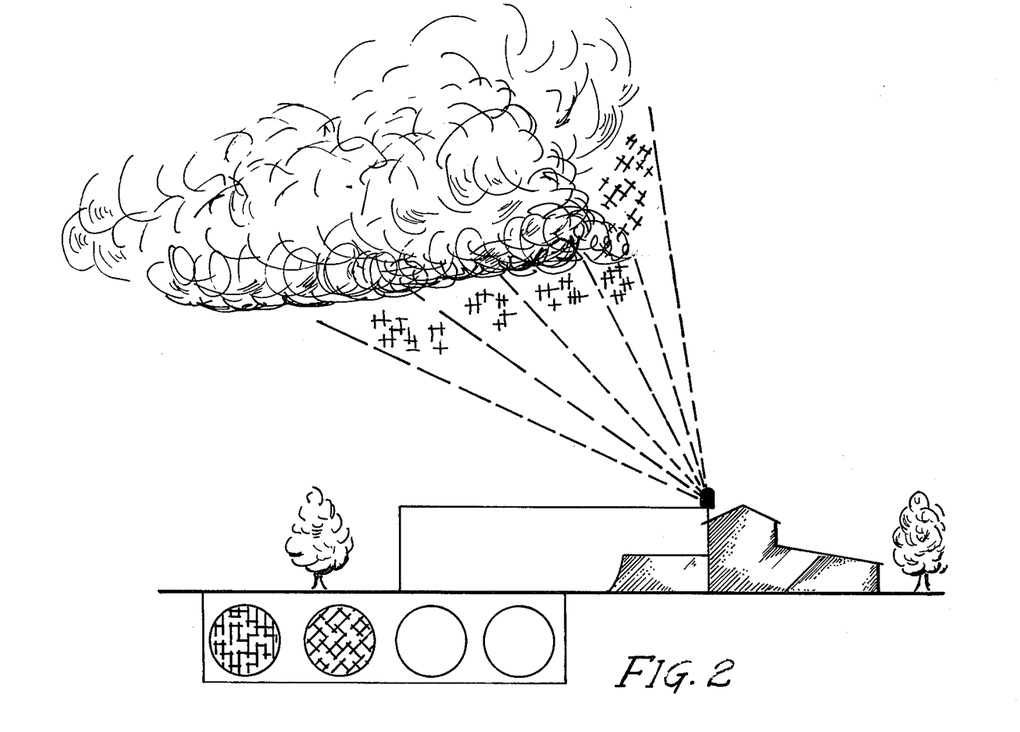
FIG. 2 shows the same electrical storm as in FIG. 1 on approach to a sensor unit showing the second lamp signal.

FIG. 2. As the electrical storm approaches a sensing station higher positive fields are sensed to +1,500 volts per meter with activity (yellow and amber light 12a and 12b).

Figure 3:
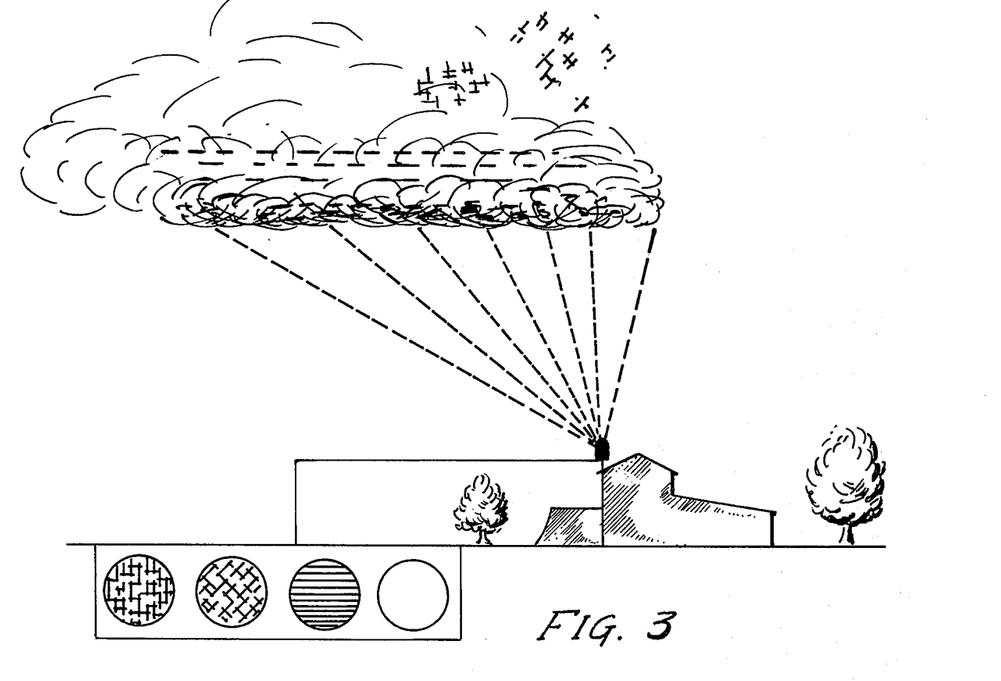
FIG. 3 again places the electrical storm even nearer to the sensor units showing the third lamp signal.

FIG. 3. Sensing station measures low negative field of −1000 volts per meter and activity (yellow, amber and blue lights 12a, 12b, and 12c).

Figure 4:
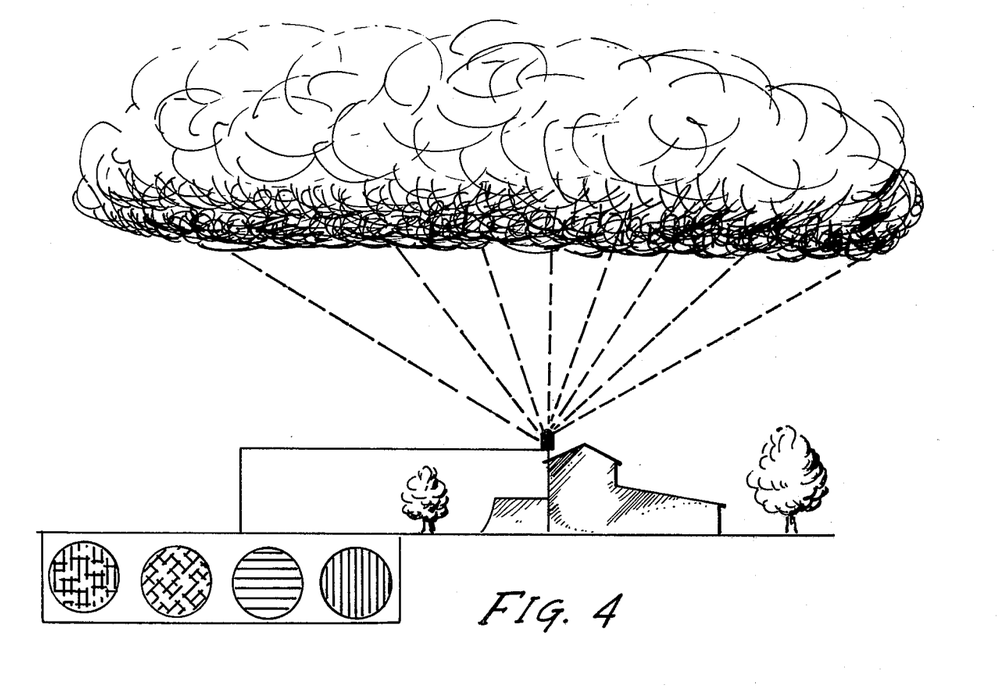
FIG. 4 now has the electrical storm over the sensor unit with the fourth lamp signal.

FIG. 4. A receiving station directly beneath the electrical storm will sense a negative build-up of about 3,000 volts to 10,000 volts per vertical meter with activity (yellow, amber, blue and red lights 12a to 12d).

Figure 5:
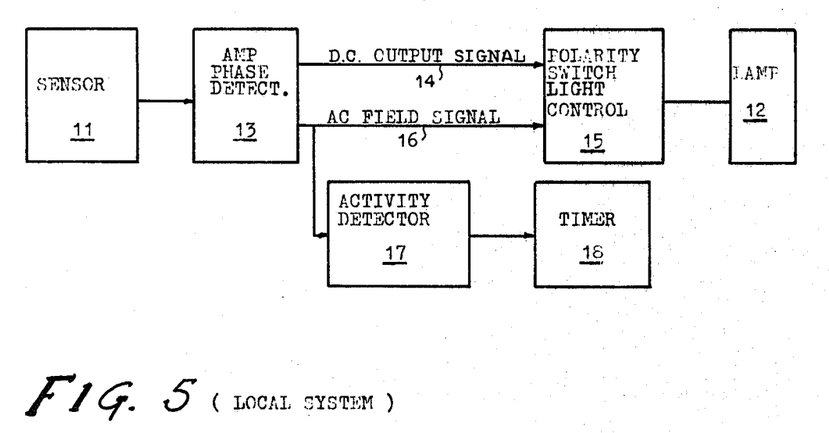
FIG. 5 is a block diagram of a portion of the inventive concept.

In the block diagram of FIG. 5 there is shown a sensor 11, signal lights 12, an amplitude and phase detector 13 having a DC output 14, polarity switch and light control 15, an AC output field signal 16, an activity detector 17 and a timer 18. This block diagram is the sensor assembly with a sensor unit 11. Signals from the sensor 11 are fed to the amplifier and phase detector 13, polarity switch 15 and an activity detector 17.

Figure 7:
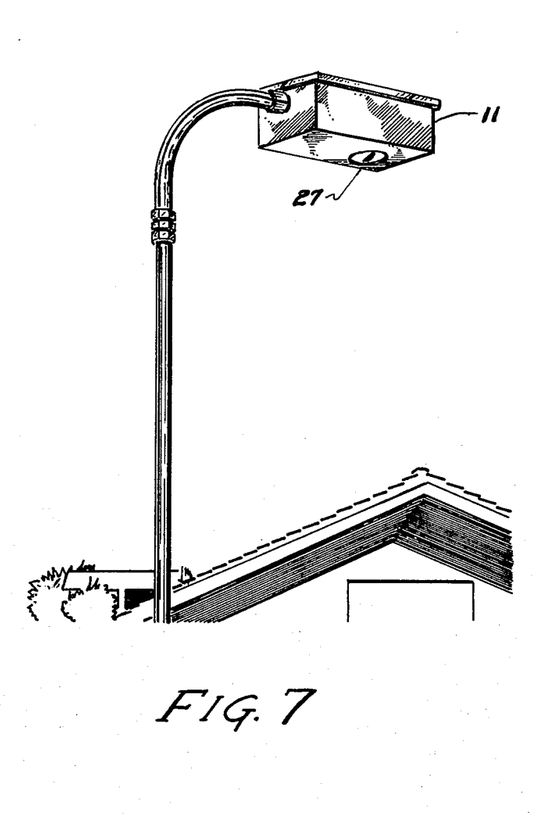
FIG. 7 shows in perspective an installed sensor unit.
Figure 8:
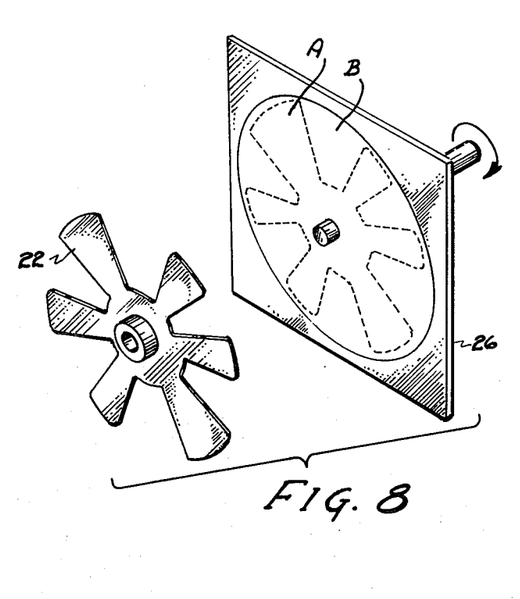
FIG. 8 shows a perspective explanation of a sensor board and rotor.

All signals that enter the sensor unit 11 of the system are electrostatic. The sensor unit 11 is mounted in a clear, free space seven to ten feet above a roof as shown in FIG. 7, or structure on which it is mounted. The output of the sensor unit 11 is a sinusoidal AC signal 16. The frequency of this signal is dependent upon the motor frequency and the number of sections in the sensor board B (FIG. 8). The amplitude of this signal is dependent upon the impressed field intensity. The phase of this signal is dependent upon the polarity of the field under measurement. This signal along with the phase reference signal from the motor is coupled into the amplifier and the phase detector 13. Block 13 has two outputs, one AC and one DC. A negative voltage 14 is provided when the field under measurement goes negative, and the amplified signal that results from the impressed field. The negative signal from block 13 connects to block 15 and operates a relay which switches the polarity of the detected amplified signal (also from block 13). This detected DC voltage is used for the strip chart recorder. The relay contacts are used to change the levels at which yellow and amber signal lights will operate and to switch the blue and red lights into the circuit.

Figure 6:
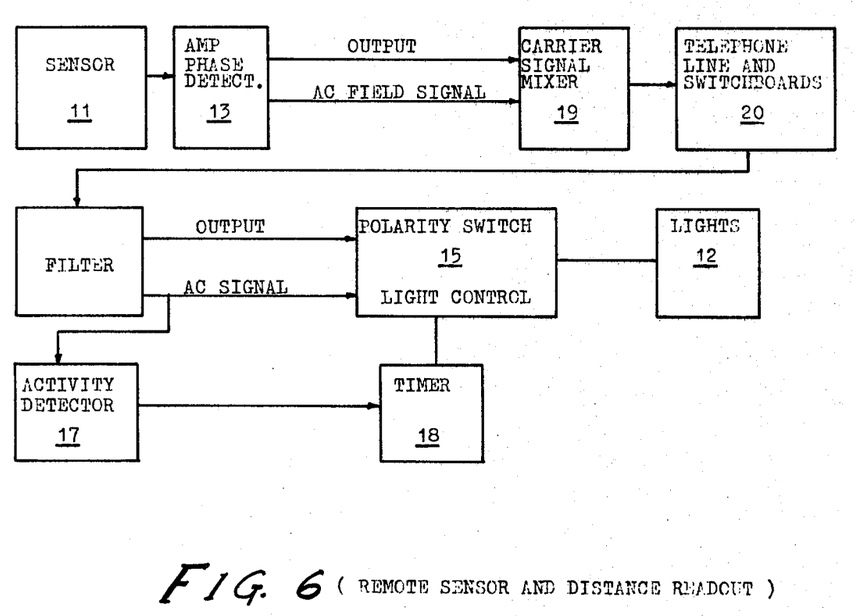
FIG. 6 shows a block diagram of another part of the inventive concept.

The sensor can be used as a remote station as shown in FIG. 6 over a telephone line 20 when processed through a mixer 19.

When used with a telephone system block 15 is located at the receiving terminal of the telephone line and contains a low pass filter that passes the AC field signals to block 15 and 17, and a high pass filter that routes to block 19 as the negative signal voltage.

The following are field intensities which the various lamps of block 12 will light:

| Percentage Of Probability | | | |
|---|---|---|---|
| 15% | Yellow = | Plus 500 volts per centimeter | (12a) |
| 35% | Amber = | Plus 1,500 volts per centimeter | (12b) |
| 15% | Yellow = | Minus 100 volts per centimeter | (12a) |
| 35% | Amber = | Minus 500 volts per centimeter | (12b) |
| 60% | Blue = | Minus 1,000 volts per centimeter | (12c) |
| 80% | Red = | Minus 2,000 volts per centimeter | (12d) |

It should be noted that the amber, blue and red lamps will not light up even with strong field intensity, unless activity is detected. This arrangement eliminates false indications that would result from high field intensity that is experienced when a storm is collapsing and also eliminates the false indications that would be experienced due to abnormally high earth fields and solar flares. The lamps in block 12 will latch "on" when the required threshold is exceeded, and they light. This is necessary so that if a person should not be viewing the panel at the moment when the lamp turns on, he would not be aware of that particular probability. A challenge button 100 (FIG. 11) is provided to unlatch the amber, blue and red lamps and let them reset themselves at the correct instant level of probability. Block 15 also contains a chime control that is activated when the activity detector turns on a 5 minute timer, then a strip chart recorder is used, its operating circuitry also comes from block 15 through a pre-set control. The input to the strip chart recorder is a voltage that is negative for negative fields and positive for positive fields. The strip chart should be of the center line type, with a sensitivity of 1 milliamp and an internal resistance of 1,000 to 1,500 ohms.

Figure 9:
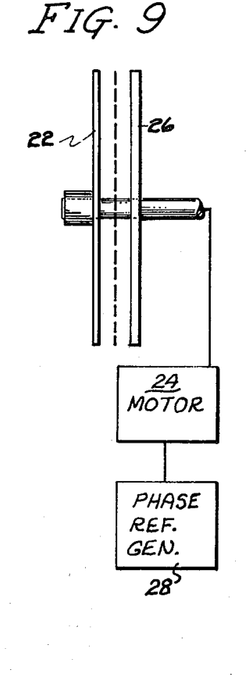
FIG. 9 is a side view of the sensor board, rotor, motor, and phase reference generator.

As shown in FIG. 7, the input from the atmosphere is received by the sensor unit 11 which is described in FIG. 8 and FIG. 9, and consists of a sensor rotor 22 coupled to an amplifier which in turn feeds a phase detector 13. Both the sensor rotor and the phase detector signal generator are turned by a motor 24. The field intensity is measured by a meter.

Figure 10:
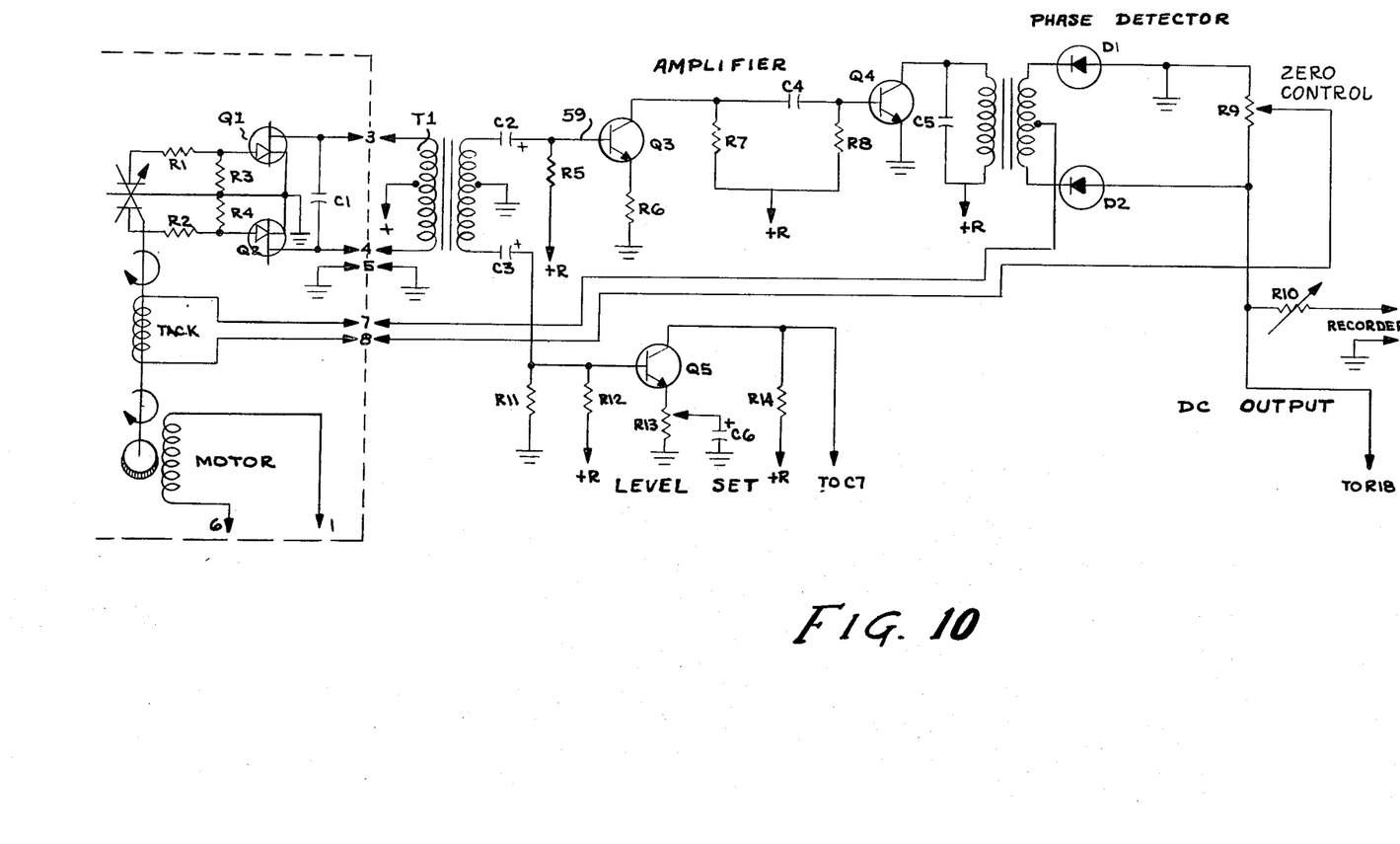
FIG. 10 is a circuit diagram of a sensor unit signal amplifier, and phase detector according to the inventive concept.

The sensor unit 11 has a sensor rotor 22 and a sensor board 26. The sensor board 26 is composed of two insulated conductive sections A and B. The rotor 22 turns in front of sensor board 26. Sections A and B of the sensor board 26 are each connected to opposite sides of respective resistors R3 and R4 of FIG. 10. Section A and B of the sensor board 26 will be alternately exposed to any field that is in front of the sensor. If a negative field is present, the electrons on sections A and B will be repelled and caused to flow to ground through resistors R3 and R4 (FIG. 10). Resistor R3 and R4 are each respectively connected to the gate electrodes of field effect transistors Q1 and Q2. The IR drop across resistor R3 will be applied to the gate of the field effect transistor Q1 which will cause a change in drain current that flows through transformer T1. The IR drop across resistor R4 will be applied to the gate of the field effect transistor Q2 which will cause a change in the drain current that flows through the transformer T1. The output signal from transformer T1 will be at a frequency that is equal to: $f = (RPM \times S)/60$. Where RPM equals the number of revolutions of the motor in one minute, S is the number segments on the sensor board for one section of A or B of sensor board 26, and the frequency of the output signal 59 is proportional to the amplitude of the field being measured.

Transistors Q1 and Q2 are a matched pair with similar characteristics. This is important so that the input circuit will have a high common mode rejection ratio.

Figure 11:
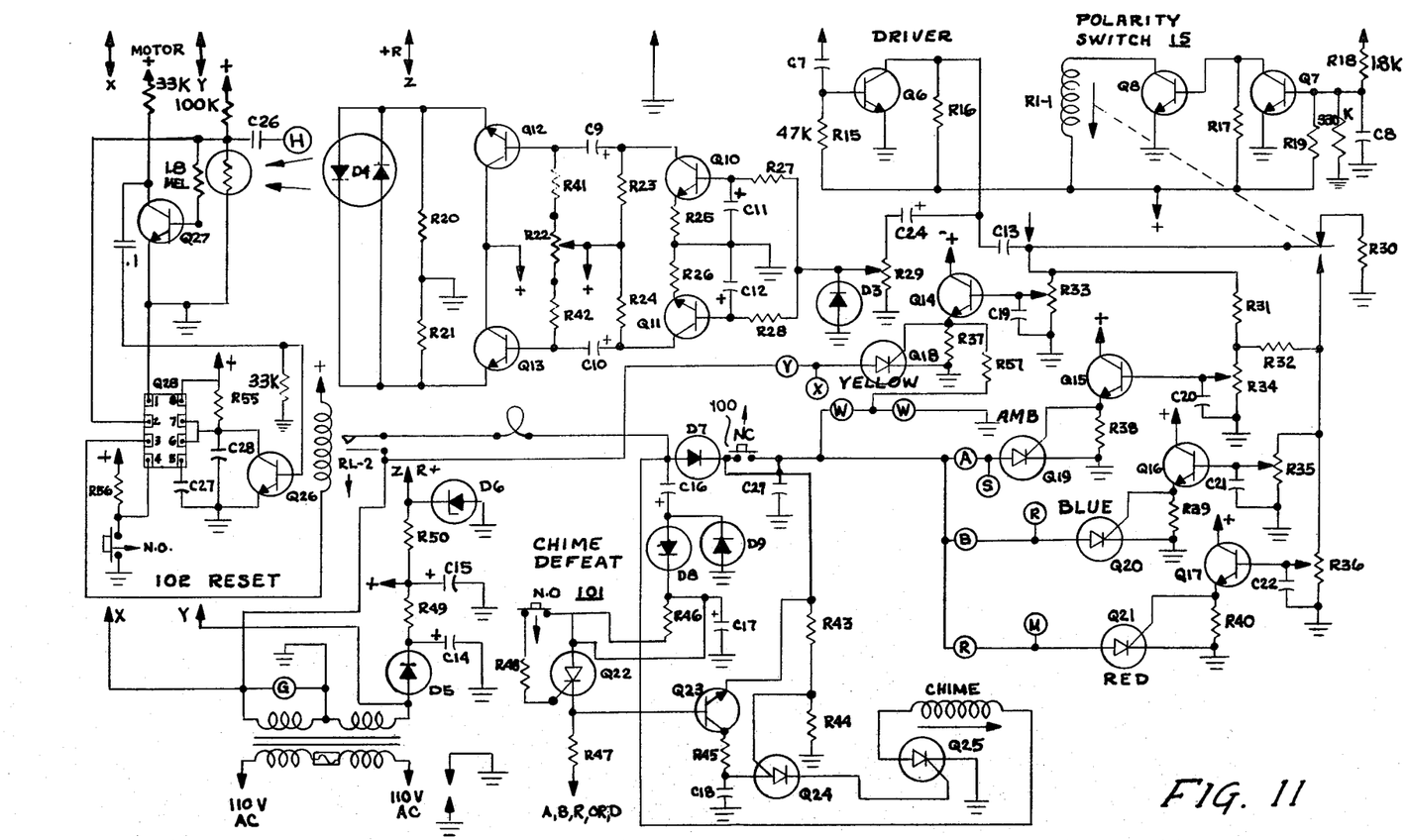
FIG. 11 is a circuit diagram of the activity detector, warning light control, chime control, timer, and power supply.

Transformer T1 is coupled to a first amplifier Q3 and a second amplifier Q5 which sets the signal level. Amplifier Q3 is coupled to a driver Q4 which in turn is coupled to the phase detector R9 operating at a zero control. Recorder level is set with R10. These components of sensor block 11 are shown in FIGS. 10 and 11 which also shows the amplitude and phase detector 13 and the drive motor 33 and other components of the system. The sensor unit consists of field effect transistors Q1, Q2 and resistors R3, R4 in impedance matching configuration. The output from transistors Q1 and Q2 is across a transformer T1 which in turn feeds the amplitude and phase detector 13. This component 13 will have a DC output 14 to amplifier transistor Q7 feeding a driver transistor Q8.

Component 13 will also have an AC side consisting of amplifier Q5. Motor 24 also turns a tachometer 28 which center taps the secondary of transformer T2 and sets the zero control of resistor R9.

The output from the phase detector is to the polarity switch and light control 15 via resistor R18. Polarity control switch and light control 15 consists of transistors Q7, Q8, which control a resistor network R31 to R36 which control transistors Q14 to Q17. These in turn control silicon controlled rectifiers Q18 to Q21 which are yellow Q18, amber Q19, blue Q20 and red Q21. The activity detector 17 is fed by driver transistor Q6.

The lamp circuit is coupled to the chimes control circuit 15. This circuit has a challenge button 100 which is a normally closed switch. It is also possible to turn off the chimes by a chimes defeat button 101 which is a normally open switch. The timer 18 can be reset by a timer reset button 102, a normally open switch.

Before the amber, blue or red lamps can operate, the activity detector 17 must trigger the timer 18. The output signal from block 13 is connected to an input potentiometer R13 through amplifier Q6. This control can be used to adjust its operation to low levels of signals (distant storms) or to higher levels which are the result of electrical storms close to the sensor.

The output arm on this control R29 has a diode D3 connected to it to ground so that the detected signal voltage is positive with respect to ground. This DC voltage is applied to activity detector 17 as the input of two amplifiers Q10 and Q11. The time constant of these two amplifiers are set by capacitor C11 and resistor R27 which is short, and by capacitor C12 and resistor R28 which is longer, therefore, a lag will occur in the circuit with the longer time constant when the signal level changes. The output from one of these amplifiers is a lag voltage as compared to the other signal or reference signal. Each of these two signal voltages are applied to their own power amplifier Q12 and Q13. The output from these two power amplifiers Q12 and Q13 is applied to two optical couplers D4 and R93 in such a manner so that rapid increases in input signal level to the activity detector will cause one of the light emitting diodes in one of the couplers to light. The output from this coupler will be a pulse that indicates a rapid increase in field or a distant lightning stroke. A rapid decrease in input signal level to the activity detector will cause the other light emitting diode in the other coupler to light. Thus, the output from the coupler indicates a nearby stroke of lightning. These pulses are used to start the five minute timer. This circuit allows the activity detector 17 to follow slow changes in the field strength without being in an unbalanced state and lighting either light emitting diode. This is important so that the timer will not be triggered by sunrises, sunsets, or solar flares. Changes of field strength of either polarity of 100 volts/meter or more in a time period of 0.2 seconds or less will cause the activity detector to issue one or more pulses. Changes of atmospheric field at a lower value of voltage in longer time periods will not operate the activity detector. Transistor Q27 and transistor Q26 are used to reset the timer at zero every time activity is detected.

It is to be observed therefore that the present invention provides for an electrical storm forecast system having a sensor unit for receiving electrostatic field information, an amplitude and phase detector coupled to the sensor unit, and information processing means coupled to the amplitude phase detector. The sensor unit has sensor board means having two alternately conductive sections (A, B) radially disposed around a center; rotor blades corresponding to said sections for rotation in a plane adjacent to the sensor board means.

First and second field effect transistors are fed by the sensor board coupled to first and second resistors, said field effect transistors each have an output side connected to a transformer with a center tapped primary and a secondary winding, said primary winding having two ends, one end each being connected to an output side; and, an activity detector that detects changes of the earth's field intensity as small as 1 volt/cm in 0.2 seconds or less, a timer that retriggers each time the activity detector issues a pulse, and holds the warning lights to a stand-by state at a given time after the last pulse from the activity detector. There is also a circuit to challenge the warning level and the selection of different alarm levels. The system can be operated at a distance by the use of a telephone circuit.

I claim:

1. A storm forecast system including a sensor unit for receiving electrostatic field information, an amplitude and phase detector coupled to said sensor unit, and information processing means coupled to said amplitude phase detector, said system comprising:
   (a) sensor board means (26) having two alternately conductive sections (A, B) radially disposed around a center;
   (b) a rotor (22) with blades corresponding to said sections for rotation in a plane adjacent to said sensor board means;
   (c) first and second resistors (R3, R4) in series with a center point, said resistors each having an outer end coupled to one of said sections;
   (d) first and second field effect transistors (Q1, Q2) coupled to said first and second resistors, said field effect transistors each having an output side;
   (e) a transformer (T1) with a center tapped primary and a secondary winding, said primary winding having two ends, one end each being connected to an output side;
   (f) a rotating phase reference generator (28) coupled to said sensing board means (2b);
   (g) a phase detector including first and second diodes (D1, D2);
   (h) amplifier means coupling the output of said sensor unit to said phase detector; and,
   (i) recorder terminals for coupling a recorder to said phase detector.

2. A system as claimed in claim 1 including a resistor network, colored lamps enabled by said resistor network indicating different alarm levels.

3. A system as claimed in claim 2, including relay means coupled to said resistor network.

4. A system as claimed in claim 3, including alarm means coupled to said relay means.

5. A device as claimed in claim 1, including:
   (a) a polarity switch (15) coupled to said phase detector;
   (b) a resistor network (R31 - R36) coupled to said polarity switch (15); and,
   (c) transistors (Q14 - Q17) coupled to silicon controlled rectifiers coupled to each resistor of said network to enable lamp means (12a - 12d) to give yellow, amber, blue and red light.

6. A system as claimed in claim 2, including an activity detector means (17) coupled to said sensor unit having a variable resistor (R29), a diode (D3) connected to said variable resistor, timer means (18) with long and short time constants means (C11, C12), and optical couplers (D4, R93) to provide signals as to rapid increases or decreases in storm field intensity.

* * * * *